(12) United States Patent
Kindt et al.

(10) Patent No.: US 6,720,592 B1
(45) Date of Patent: Apr. 13, 2004

(54) APPARATUS FOR HIGH SENSITIVITY, LOW LAG, HIGH VOLTAGE SWING IN A PIXEL CELL WITH AN ELECTRONIC SHUTTER

(75) Inventors: Willem Johannes Kindt, Sunnyvale, CA (US); Philipp Lindorfer, San Jose, CA (US)

(73) Assignee: National Semiconductor Corp., Santa Clara, CA (US)

( * ) Notice: Subject to any disclaimer, the term of this patent is extended or adjusted under 35 U.S.C. 154(b) by 42 days.

(21) Appl. No.: 09/895,803

(22) Filed: Jun. 29, 2001

(51) Int. Cl.[7] .............................................. H01L 27/148

(52) U.S. Cl. ....................... 257/231; 257/239; 257/292; 257/444; 250/208.1

(58) Field of Search ................................ 257/231, 239, 257/292, 444; 250/208.1

(56) References Cited

U.S. PATENT DOCUMENTS

| | | | | | |
|---|---|---|---|---|---|
| 5,402,459 | A | * | 3/1995 | Hynecek | 377/58 |
| 5,841,126 | A | * | 11/1998 | Fossum et al. | 250/208.1 |
| 5,898,168 | A | * | 4/1999 | Gowda et al. | 250/208.1 |
| 5,965,871 | A | * | 10/1999 | Zhou et al. | 250/208.1 |
| 6,215,113 | B1 | * | 4/2001 | Chen et al. | 250/208.1 |
| 6,317,154 | B2 | * | 11/2001 | Beiley | 348/308 |
| 6,320,616 | B1 | * | 11/2001 | Sauer | 348/241 |
| 6,429,413 | B1 | * | 8/2002 | Kawahara et al. | 250/208.1 |
| 2002/0011551 | A1 | * | 1/2002 | Nair | 250/208.1 |

FOREIGN PATENT DOCUMENTS

| | | | |
|---|---|---|---|
| JP | 63 90974 | * | 4/1988 |
| JP | 11-164208 | * | 6/1999 |
| JP | 11-261896 | * | 9/1999 |
| JP | 11-274463 | * | 10/1999 |
| JP | 2000 174247 | * | 6/2000 |
| JP | 2000-174247 | * | 6/2000 |

OTHER PUBLICATIONS

Mendis et al., "A 128 X 128 CMOS Active Pixel Image Sensor for Highly Integrated Imaging Systems", *IEDM Technical Digest*, 1993, pp. 583–586.

Huat et al., "A 128 X 128–Pixel Standard–CMOS Image Sensor with Electronic Shutter", *IEEE Journal of Solid–State Circuits*, vol. 31, No. 12, Dec. 1996, pp. 1922–1930.

Mendis et al., "CMOS Active Pixel Image Sensors for Highly Integrated Imaging Systems", *IEEE Journal of Solid–State Circuits*, vol. 32, No. 2, Feb. 1997, pp. 187–197.

Yang et al., "A Snap–Shot CMOS Active Pixel Imager for Low–Noise, High–Speed Imaging", *IEDM Technical Digest*, 1998, pp. 45–48.

Stevanovic et al., "A High Frame Rate Image Sensor in Standard CMOS–Technology", *IEEE workshop on charge–coupled devices and advance image sensors*, Nagano, Japan, 1999, pp. 316–319.

* cited by examiner

*Primary Examiner*—Nathan J. Flynn
*Assistant Examiner*—Ahmed N. Sefer
(74) *Attorney, Agent, or Firm*—Darby & Darby P. C.; John W. Branch

(57) ABSTRACT

The present invention is directed to a photogate based pixel cell with an electronic shutter and which provides relatively low lag and high sensitivity for sensing infrared light reflected from objects. Additionally, this invention eliminates the need for a transfer gate in the pixel cell. In one embodiment, the reset and shutter transistors are implemented with PMOS transistors so that the pixel cell can have an increased dynamic range and a relatively high voltage swing. In another embodiment, the actual size of each pixel cell can be further reduced when the reset gate and the electronic shutter are implemented with NMOS transistors. Also, when a P– well is not disposed beneath the photogate, the ability of the pixel cell to sense infrared light is improved. Correlated double sampling can be used to improve the accuracy of the signal read out from the pixel cell.

16 Claims, 8 Drawing Sheets

US 6,720,592 B1

APPARATUS FOR HIGH SENSITIVITY, LOW LAG, HIGH VOLTAGE SWING IN A PIXEL CELL WITH AN ELECTRONIC SHUTTER

FIELD OF THE INVENTION

The present invention relates to an image sensing pixel cell architecture, and particularly to an image sensing pixel cell architecture that provides high sensitivity, relatively lag-free response and an electronic shutter.

BACKGROUND OF THE INVENTION

Recently, CMOS image sensors characterized by their low power consumption have been in great demand as an image capturing device for machine vision applications. Typically, an image sensor includes at least several hundred pixel cells arranged in a grid. Also, in many machine vision applications each pixel cell is optimized for sensing particular types of light, e.g., infra-red.

To capture a still image of a fast moving object, a CMOS image sensor typically operates an electronic shutter for each pixel cell. However, to freeze an image of a fast moving object, the electronic shutter can only be held open for a relatively brief period of time. As a result, only a small amount of light is incident upon the pixel cell for integration. Since the amount of incident light is relatively small, it is difficult for an image sensor to output a signal that represents an accurate image of a fast moving object. To accommodate for this difficulty, pixel cells are often provided with a relatively high sensitivity. Unfortunately, in the past, these pixel cells with high sensitivity had significant lag that caused blur in an image of a fast moving object Therefore, there has been a need for a highly sensitive and lag free pixel cell architecture with an electronic shutter for use in CMOS image sensors.

SUMMARY OF THE INVENTION

The present invention is directed to a photogate based pixel cell architecture that provides relatively low lag, high sensitivity for infrared light and high voltage swing (dynamic range) with an electronic shutter. This invention eliminates the need for a transfer gate; and prevents overexposure during idle and storage cycles. Blooming cannot occur during these cycles because the photogate is continuously reset. The invention further improves the dynamic range of each pixel cell by enabling the implementation of the reset gate and the electronic shutter with PMOS devices.

In one embodiment of the invention, a photogate is disposed over a P− substrate. Electrons collect in a region underneath the photogate when a potential on the photogate is high and light is incident on the photogate. An N+ floating diffusion area is disposed adjacent to the photogate and on the surface of the P− substrate. A first and a second capacitance are disposed on opposite sides of a shutter transistor. The N+ floating diffusion area and the first and second capacitances store electrons that migrate from underneath the photogate when the potential on the photogate is low. A reset transistor is coupled between the N+ floating diffusion area and a supply voltage. The electrons stored in the N+ floating diffusion area move to the supply voltage when the reset transistor conducts. Also, the gate of a first transistor is coupled to the shutter transistor. When the shutter transistor is non-conducting, a signal voltage representing light incident on the photogate is stored on the second capacitance that is disposed on one side of the shutter transistor and coupled to the gate of the first transistor, so that the signal voltage is presented at the gate of the first transistor for read out.

In yet another embodiment of the invention, when the shutter transistor is conducting, the electrons stored in the second capacitance are converted into the signal voltage. Also, the first capacitance and second capacitance include parasitic capacitances, source capacitance of the reset transistor, channel capacitance of the shutter transistor and the junction capacitance of the N+ floating diffusion area.

In still another embodiment of the invention, the reset transistor and the shutter transistor are PMOS devices that enable a larger voltage swing inside the pixel cell and greater dynamic range for the signal voltage.

In a further embodiment of the invention, the reset transistor and the shutter transistor are NMOS devices that enable a small size for the pixel cell.

In another embodiment of the invention, a P− well is disposed around the circumference of the photogate. The P− well provides lateral confinement for electrons collected underneath the photogate. Also, the absence of the P− well beneath the photogate enables electrons induced by infrared light to collect underneath the photogate.

In yet another embodiment, at least a correlated double sampling method is employed to read out the voltage signal. Also, the source follower circuit includes the first transistor and a second transistor. When the second transistor conducts, the signal is available for read out.

In still another embodiment, an image sensor includes a plurality of pixel cells arranged in a grid.

These and other features as well as advantages, which characterize the invention, will be apparent from a reading of the following detailed description and a review of the associated drawings.

DETAILED DESCRIPTION OF THE PREFERRED EMBODIMENT

The present invention is directed to a photogate based pixel cell architecture that provides relatively low lag, high sensitivity for infrared light and high voltage swing (dynamic range) with an electronic shutter. This invention eliminates the need for a transfer gate; and prevents overexposure during idle and storage cycles. Blooming cannot occur during these cycles because the photogate is continuously reset. The invention further improves the dynamic range of each pixel cell by enabling the implementation of the reset gate and the electronic shutter with PMOS devices.

Figure 1:
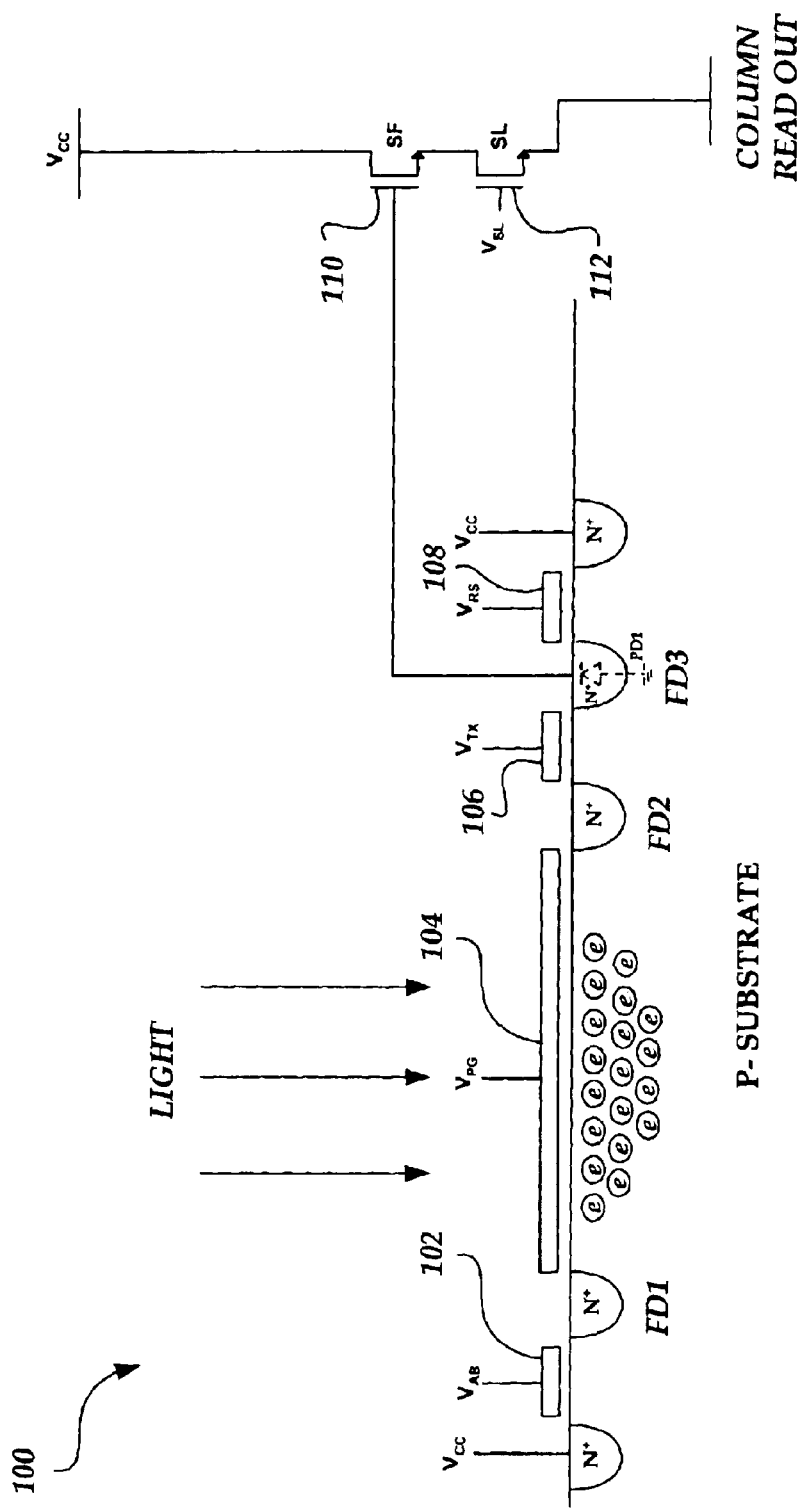
FIG. 1 is a schematic diagram of an exemplary embodiment of a pixel cell architecture having a transfer gate and an anti-blooming gate.

To appreciate the present invention, it is important to understand the difficulties and operation of other known pixel cell architectures. For example, FIG. 1 illustrates a schematic diagram 100 of a known photo-gate based pixel cell architecture with an electronic shutter. A photogate 104 is disposed over a P doped substrate. When light is incident upon photogate 104 and the photogate is "turned on" by a high potential (Vpg), electrons start collecting under the photogate.

Adjacent to photogate 104 is an anti-blooming gate 102 that is biased with an intermediate potential (Vab) to prevent the migration of excess electrons that have collected under photogate 104 (generated by pixel cell overexposure) to adjacent pixel cells. This functionality is achieved by creating an alternative path underneath anti-blooming gate 102 so that excess electrons will flow to the voltage supply (Vcc) instead of neighboring pixels. The intermediate potential on the anti-blooming gate is less than the high potential on the photogate and more than ground.

On the opposite side of photogate 104 is a transfer gate 106, which is coupled to an intermediate potential. The intermediate potential on the transfer gate is less than the high potential on the photogate and more than ground. The gate of a first transistor 110 is coupled to an N+ floating diffusion area adjacent to transfer gate 106. The potential on the gate of first transistor 110 is sensed; and this transistor is employed as a source follower where the potential on its gate is copied onto its source.

When a second transistor 112 is turned on (conducts). The first and second transistor (110 and 112) are arranged as a source follower/row select switch readout circuit. On the opposite side of transfer gate 106, a reset gate 108 is disposed and which controls when the floating diffusion (FD3) and the gate of first transistor 110 are reset to the supply voltage (Vcc).

The method of operation for this pixel cell architecture is described in greater detail in Guang Yang, Orly Yadid-Pecht, Chris Wrigley and Bedabrata Pain: "A Snap-Shot CMOS active pixel imager for low-noise, high-speed imaging", IEDM Technical Digest, 1998, page 4548, and which is incorporated herein by reference. Also, the method of operation for a substantially similar photo-gate based pixel cell architecture without an electronic shutter is described in S. K. Mendis, S. E. Kemeny and E. R. Fossum: "A 128*128 CMOS active pixel image sensor for highly integrated imaging systems", IEDM Technical Digest, 1993, pages 583–586; and S. K. Mendis et al.: "CMOS active pixel image sensors for highly integrated imaging systems", IEEE Journal of Solid State Circuits, vol. 32, no. 2, February 1997, 187–197, both of these publications are incorporated herein by reference.

Figure 2:
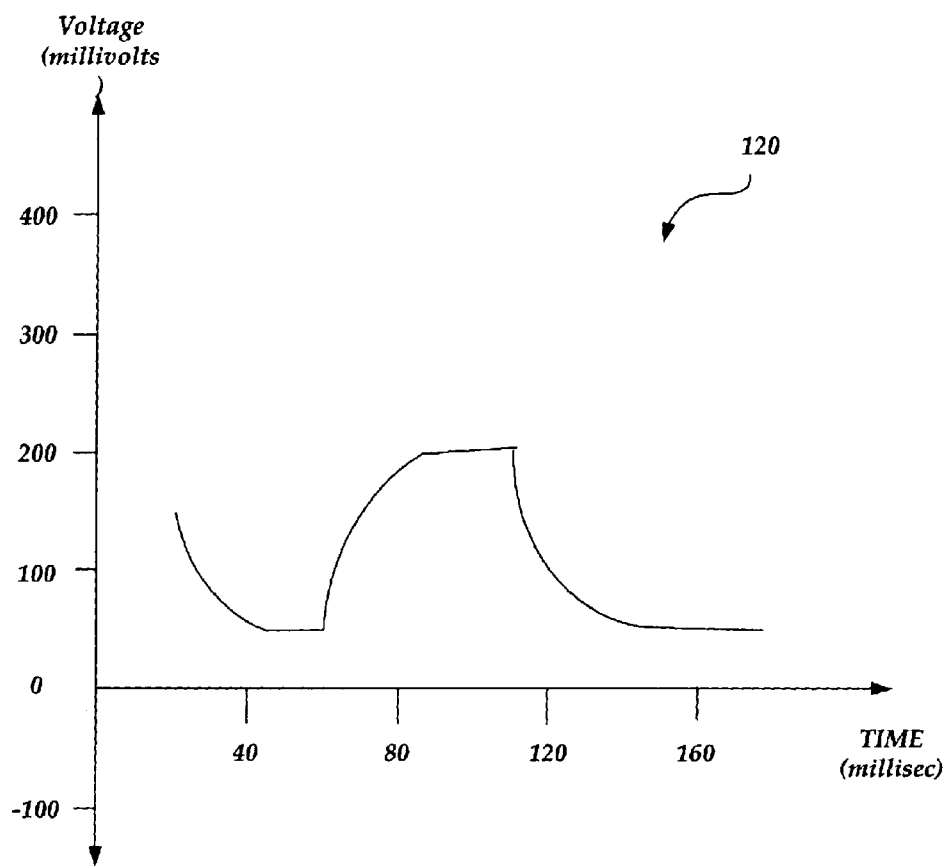
FIG. 2 is a graphical representation of lag in a pixel cell architecture having a transfer gate and an anti-blooming gate.

FIG. 2 illustrates an exemplary graphical simulation 120 of the operational lag often present in the photo-gate based pixel cell architecture shown in FIG. 1. As illustrated, operational lag can have a significant effect for this type of photo-gate based pixel cell architecture. A lag free pixel cell response would be substantially similar to a square wave instead of the waveform shown in FIG. 2.

Figure 3:
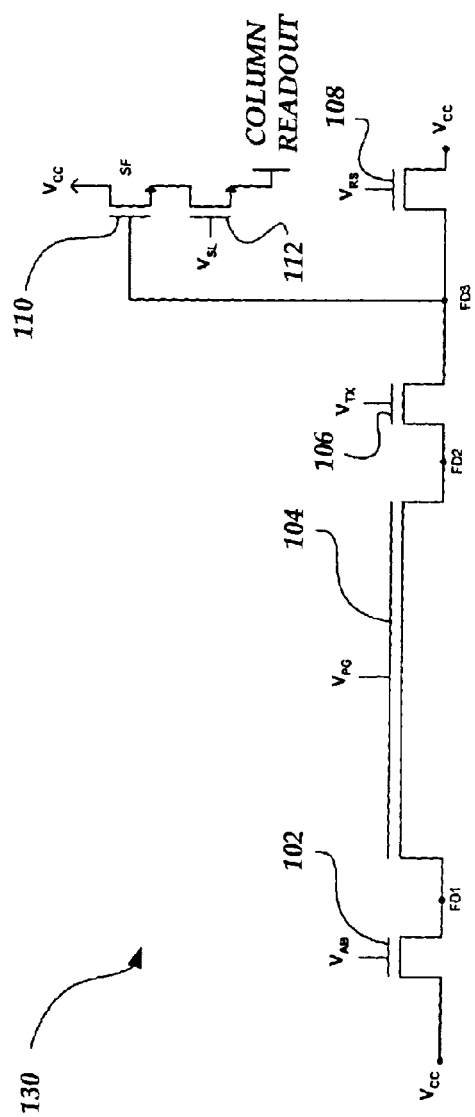
FIG. 3 is an electronic schematic that represents an exemplary embodiment of a pixel cell architecture having a transfer gate and an anti-blooming gate.

FIG. 3 illustrates an equivalent electronic schematic diagram 130 for the photo-gate based pixel cell architecture shown in FIG. 1. In this photo-gate based pixel cell, it can be understood that the operational lag is substantially caused by the application of relatively low voltages to anti-blooming gate 102 (Vab) and transfer gate 106 (Vtx). During reset (when at the start of integration the channel beneath the photogate is reset by pulling the photogate low) and during transfer (when the photogate is pulled low and the electrons are transferred from from underneath the photogate to the third floating diffusion area "FD3") either anti-blooming gate 102 or transfer gate 106 are biased just above the threshold voltage (Vt). Also, the transistors formed by these two gates operate as a source follower that resets the potential on the first and second floating diffusions FD1 and FD2 to the gate potential on these transistors minus the threshold voltage (Vt). However, because this source follower is operating at substantially zero current, the "reset" is a very slow process (creates high lag) and the reset potential becomes a function of the amount of charge integrated (collected) beneath photogate 104 during photocurrent integration.

Figure 4:
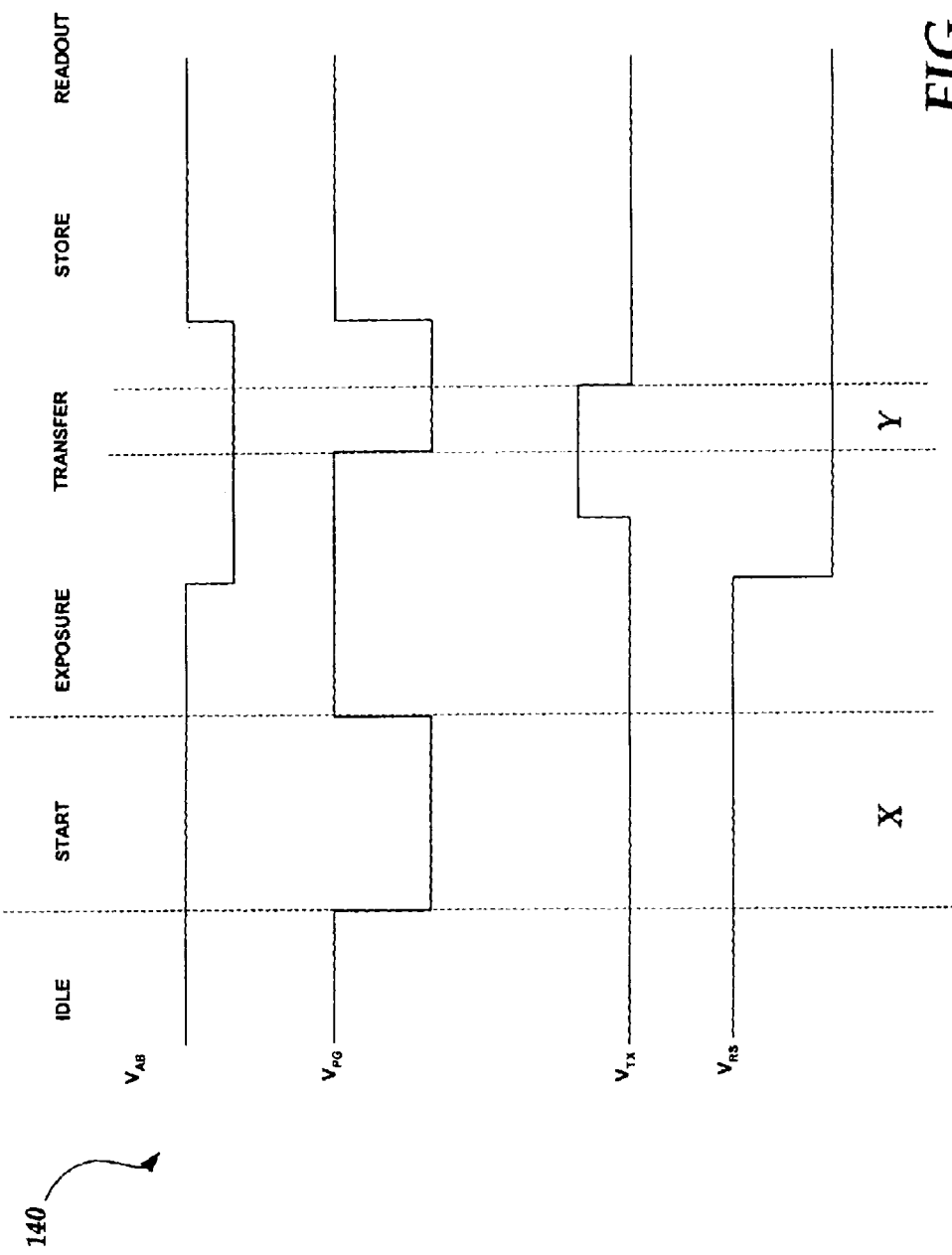
FIG. 4 is a graphical representation of the operational cycle for a pixel cell architecture having a transfer gate and an anti-blooming gate.

FIG. 4 illustrates a complete cycle for the operation of the photogate based pixel cell shown in FIGS. 1 and 3. In FIG. 4, the "X" and "Y" regions graphically show when the voltages on the anti-blooming and transfer gates (Vab and Vtx) are set at relatively intermediate potentials and the voltage on the photogate is low during this pixel cell's operational cycle, which is a substantial contribution to the lag discussed above.

One way to substantially reduce this lag is to drive transfer gate 106 to a much larger potential during column readout at the source of second transistor 112. For example, during the migration (transfer) of the electrons from underneath photogate 104, the voltage (Vtx) on transfer gate 106 could go high and so that the electrons assembled beneath photogate 104 are shared between the photogate and the transfer gate. Next, when the voltage (Vpg) on photogate 104 goes low, substantially all of the electrons would migrate from underneath the photogate to beneath transfer gate 106. As a result, when the voltage (Vtx) on transfer gate 106 goes low, substantially all of the electrons would move to FD3 (although some small portion of the electrons could still be left behind on FD2).

Another way to further reduce/eliminate lag in a photogate based pixel cell is to pull high both the voltage (Vrs) on reset gate 108 and the voltage (Vtx) on transfer gate 106, prior to starting integration under photogate 104 and during the idle phase before integration is started. This action will preset the potential on the floating diffusions (FD2 and FD3) to a well defined value (a full reset at a known potential) which does not depend on the signal charge from the previous integration cycle. To achieve this full reset, the voltage (Vtx) on transfer gate 106 is pulled at least one threshold voltage (Vt) above the supply voltage Vcc when transfer gate 106 is implemented with an n-channel MOS device. However, this method for reducing lag in a pixel cell has the disadvantage that the readout of the signals integrated during capture of the previous image can not occur simultaneously with the integration of the next image. In some applications, this limitation is not an issue and the significant decrease in operational lag is highly advantageous.

By employing the concept of resetting the floating diffusions to a known potential in the operational cycle and changes in the typical operational cycle, the present invention realizes another embodiment of a photogate based pixel cell that does not require the functionality provided by the transfer gate. Also, since the invention does not provide blooming overexposure protection during integration, an anti-blooming gate can be optionally included with the pixel cell depending on the application.

Figure 5:
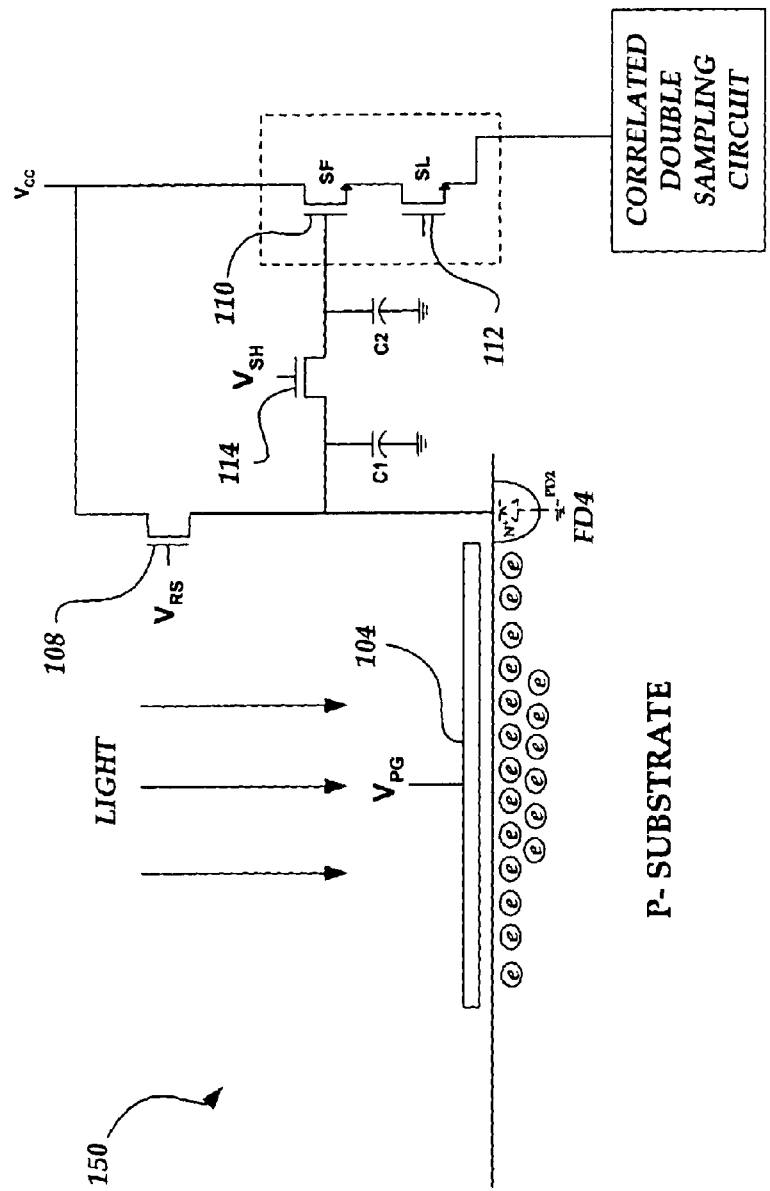
FIG. 5 is a schematic diagram of an exemplary embodiment of the invention.

FIG. 5 illustrates a schematic diagram 150 of a photogate based pixel cell with an electronic shutter that does not include transfer or anti-blooming gates. This photogate based pixel cell includes photogate 104, reset gate 108, shutter gate 114 (electronic shutter) and a source follower/ row select switch readout circuit enabled by first and second transistors 110 and 112.

Figure 6:
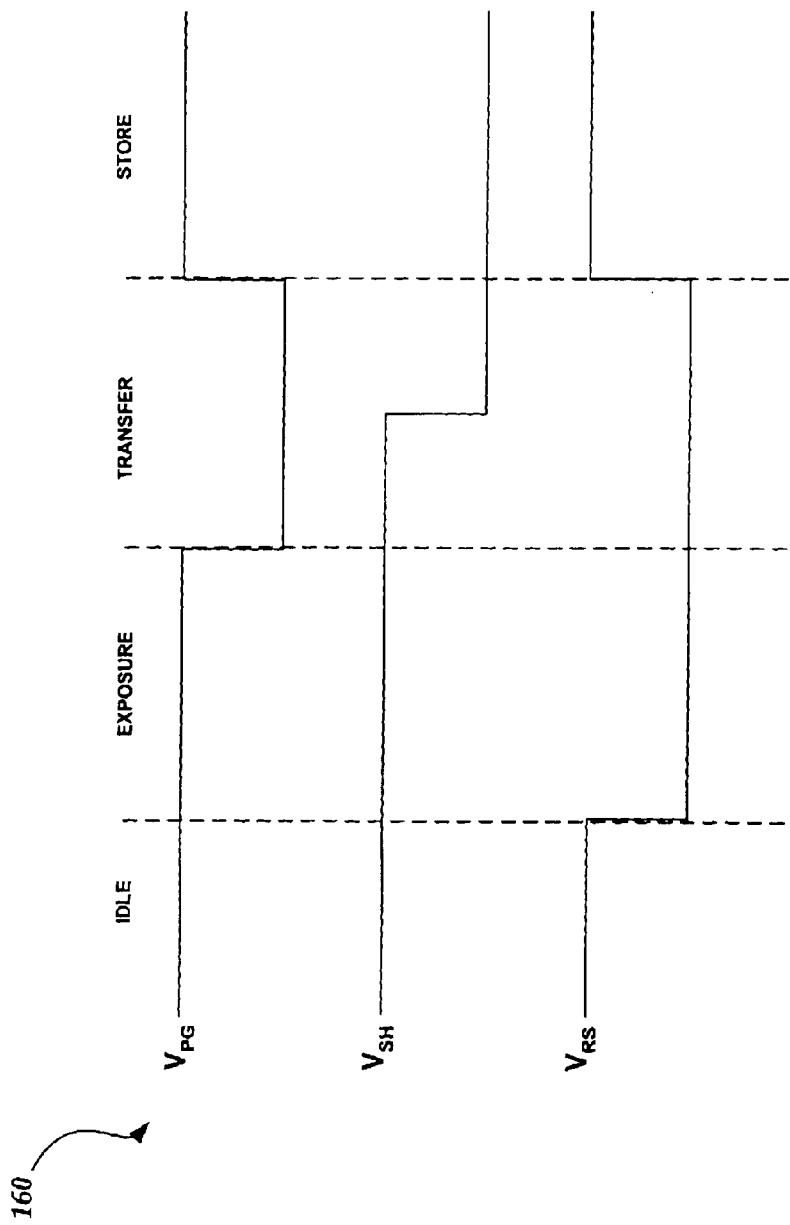
FIG. 6 is a graphical representation of the operational cycle for an exemplary embodiment of the invention.

FIG. 6 illustrates a graphical representation 160 of an operational cycle for a photogate based pixel cell that does not include transfer or anti-blooming gates. During the idle period, reset gate 108 is pulled high (Vrs) and the potential on photogate 104 is set high (Vpg). Also, shutter gate 114 is pulled high (Vcc). In the idle period, all optically generated charges (electrons) underneath the photogate flow towards the supply voltage (Vcc) through the transistor formed by reset gate 108. Next, in the exposure period, reset gate 108 is turned off (set to a low potential), and the photo-carriers (electrons) start assembling underneath photogate 104. In the exposure period, the transistor formed by shutter gate 114 operates as a closed switch, enabling the discharge of parasitic capacitances (C1 and C2) on either side of shutter gate 114.

Subsequently, during the transfer period, the potential at photogate 104 is pulled low and all photo-induced charges that have assembled underneath the photogate start flowing towards the parasitic capacitances C1 and C2. This process gives this embodiment of a photogate based pixel cell a relatively large sensitivity, because although the photo-induced charges are captured on a relatively large area formed by photogate 104, the charge to voltage conversion of these charges collected under the photogate occurs on relatively small capacitors, i.e., parasitic capacitances C1 and C2. Also, in the transfer period, after substantially all of the photo-induced charges have moved out from under photogate 104, shutter gate 114 is pulled low. The transistor formed by shutter gate 114 stops conducting and operates as an open switch that disconnects parasitic capacitances C1 and C2 from each other. The signal created by the collection of charges under photogate 104 is now present as a voltage on both C1 and C2.

After the shutter gate transistor operates as an "open switch" for an interval of time, the store period begins. The potential (Vrs) on reset gate 108 is pulled high again. This action prevents blooming during the store period which can last significantly longer than the exposure period. During the store period, all photo-induced charges flow from underneath the photogate through the conducting reset gate transistor to the positive supply rail (Vcc). Also, during the storage period, the signal of the previous exposure period remains stored as a voltage on parasitic capacitance C2 for subsequent read out through the source follower/select switch formed by first transistor 110 and 112.

To implement switches, the invention may employ PMOS or NMOS devices for the shutter and reset transistors. With NMOS switches, the gate must be pulled at least on threshold voltage (Vt) above the potential being switched, which can be difficult when switching the voltage supply potential (Vcc). PMOS switches are easier to use when switching the voltage supply potential (Vcc), so they are preferable when a larger pixel cell can be used. However, when a relatively small pixel cell is necessary for an application, NMOS switches may be preferred. PMOS devices require a large N+ well, which makes them generally larger than NMOS devices.

Because it is the intention that the transistors formed by the shutter gate and reset gate should operate as switches, these gates should be driven beyond the voltage supply (Vcc). However, this is relatively difficult when the shutter and reset transistors are implemented with an NMOS process. In modern processes, the maximum voltage on the gate of an NMOS transistor is limited to relatively small values to prevent gate oxide breakdown. Given this gate voltage limitation, the maximum level for the supply voltage (Vcc) in pixel cells that employ NMOS devices is set relatively low. However, by limiting the maximum value for the supply voltage, the maximum voltage swing inside the pixel cell is also limited, i.e., the dynamic range of the signal generated by the pixel cell is limited by the use of NMOS devices for the reset and shutter transistors.

To further improve the dynamic range and voltage swing inside a pixel cell, the reset and shutter transistors should be implemented with a PMOS process. As a result, the pixel cell will have a substantially improved dynamic range and voltage swing compared to a similar configuration with NMOS transistors.

In the past, PMOS transistors were rarely used in photogate based pixel cells. The previous way of thinking about photogate based pixel cells is that the photogate and the transfer gate form a very small surface channel charge coupled device (CCD) structure in which charges are shifted along the surface of the structure towards a floating diffusion readout node. With this way of thinking, there is a need for at least two gate areas in the photo-sensing device, one for the photogate itself and one for the transfer gate. In the past, these gates have been implemented with a similar process, i.e., usually both were derived from the NMOS process. However, this invention eliminates the need for a transfer gate and opens the door to another way of considering the operation of a photogate based pixel cell.

Figure 7:
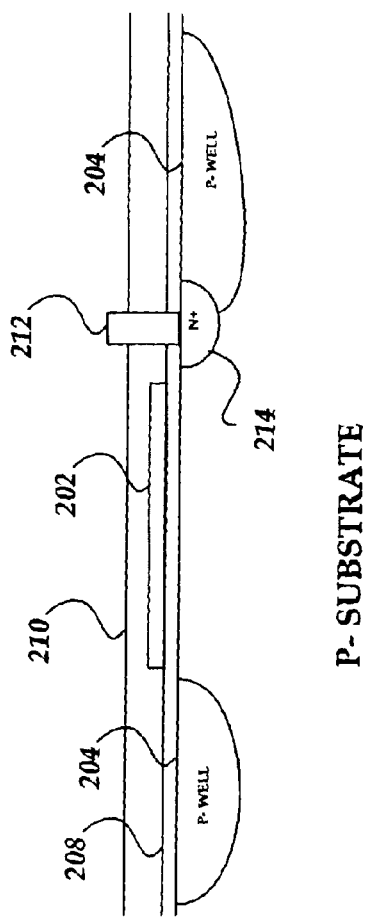
FIG. 7 is a cross-section of a photogate.

FIG. 7. shows a cross section of a photogate 202 for use in at least one embodiment of this invention. To ensure a relatively large quantum efficiency for infrared photons, a P− well is not disposed underneath photogate 202. If a P− well was disposed beneath photogate 200, the epilayer or substrate to the P− well boundary would create a barrier for photo-induced electrons that are generated below the P− well in the epilayer or substrate. Because infrared photons penetrate a silicon based device relatively deep before being absorbed, most electrons generated by infrared photons would be generated below a P− well disposed beneath the photogate. Thus, these electrons could not reach the collection region underneath photogate 202 by diffusion because of the potential barrier formed by the low-high junction of a P− well. To avoid this problem with infrared light, no P− well is disposed underneath photogate 200.

However, at the circumference of photogate 202, a P− well 204 is used as a lateral confinement for the electrons that collect under the photogate. P− well 204 does not overlap the N+ floating diffusion area 214 at the edge of photogate 202 so that reliable electron migration from the photogate to the floating diffusion area occurs. Also, a metal contact 212 is coupled to the floating diffusion area 214. A dielectric layer is disposed over photogate 202 and a gate oxide is disposed between the photogate and the P− substrate.

Figure 8:
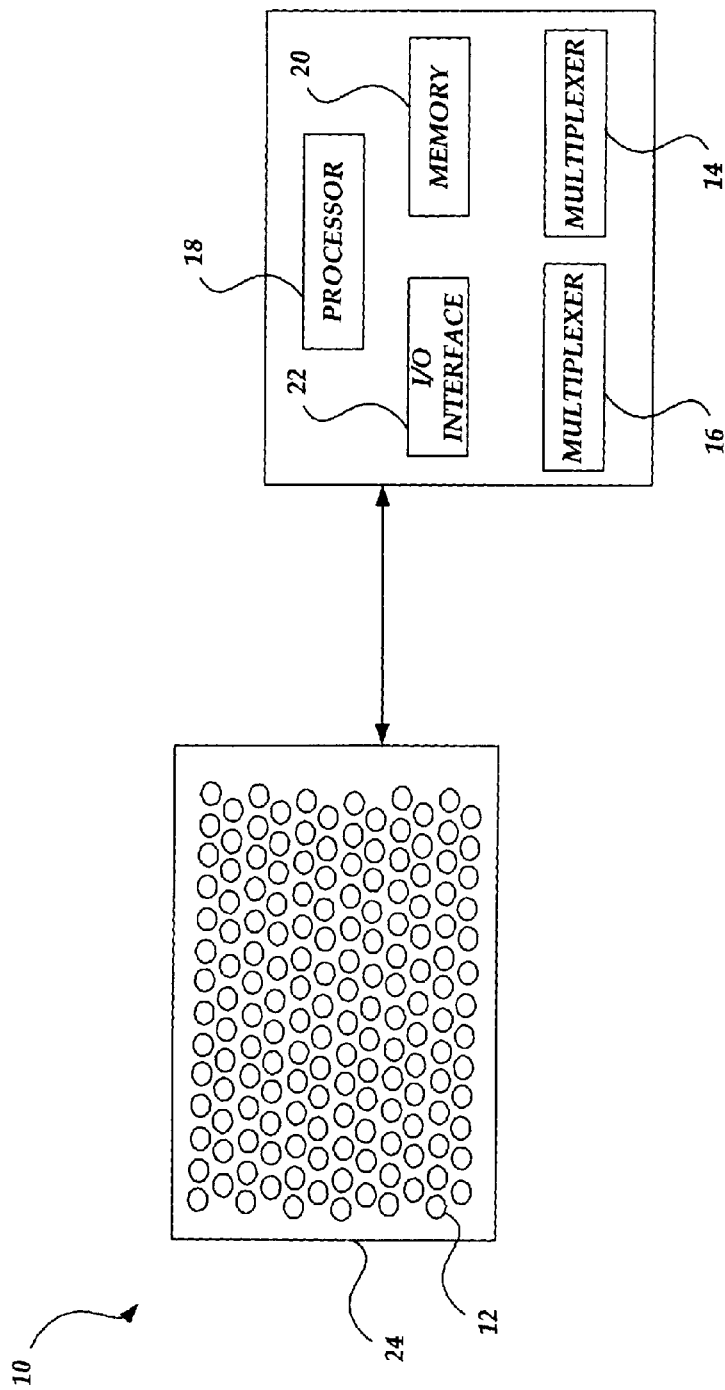
FIG. 8 is a block diagram of an exemplary embodiment of the components for an image sensor, in accordance with the invention.

FIG. 8 shows an exemplary embodiment of a CMOS image sensor 10, which includes an array 24 of individual pixel cells 12 arranged in columns and rows. A processor 18 is coupled to an input/ouput interface 22, a memory 20 and a multiplexer 14, which is employed to reset and select each row of the pixel cell array 24. The processor 18 is also coupled to another multiplexer 16 that is employed to read the value at each column for a selected row of pixel cells 12.

During the readout cycle, first, the signal is stored on parasitic capacitance C2, as shown in FIG. 5 has to be read out through the source follower/select switch system. Subsequently, the parasitic capacitance C2 is reset by opening the shutter transistor again, thereby connecting C2 to the voltage supply (Vcc) because readout occurs during the storage cycle when all reset switches in the entire array of pixel cells are switched on. After parasitic capacitance C2 has been reset, the reset potential can be read through the source follower/select switch circuit. By calculating the difference between these measurements (samples), correlated double sampling (CDS) can be implemented. CDS removes the offsets introduced by the source follower/select switch circuit. In particular, CDS removes the fixed pattern noise that would otherwise be introduced by threshold voltage (Vt) mismatches in the source followers of the individual pixel cells.

Usually, an array of pixel cells is read out row by row (all pixels in one row in parallel). During the image integration, the pixel cells are all operating in parallel. The electronic shutter switches are opened globally for all pixel cells. In one embodiment, during the readout, a very short dummy cycle is created during which the signals applied to a row of pixels are copies of the signals during the integration. The CDS circuits (one for each column line so that one row of pixels can be read out in parallel) first measure the signal level. Then, the dummy cycle is performed on the current row to be read out only. The dummy cycle is completely identical to an integration cycle, except the integration lasts very short (less than a microsecond), so (almost) no photons are integrated in the pixel cells. This creates a very accurate reset level. All offset and charge injection contributions to offsets in the signal level of the pixel cell will be present in the reset level. The primary component that is missing from the reset level is now the signal due to the integrated photoelectrons. This means that the difference between the signal level and the reset level is a very accurate representation of the optical input signal. Substantially all secondary effects can be cancelled using this CDS method.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A circuit for a pixel cell, comprising:
   (a) a photogate disposed over a P− substrate, wherein electrons collect in a region underneath the photogate when a potential on the photogate is high and light is incident on the photogate;
   (b) an N+ floating diffusion area disposed adjacent to the photogate on the surface of the P− substrate and a first and a second capacitance coupled to opposite sides of a shutter transistor, the N+ floating diffusion area and the first and second capacitances storing electrons that migrate from underneath the photogate when the potential on the photogate is low;
   (c) a reset transistor coupled between the N+ floating diffusion area and a supply voltage, wherein the electrons stored in the N+ floating diffusion area move to the supply voltage when the reset transistor conducts; and
   (d) a first transistor having a gate coupled to the shutter transistor and the N+ floating diffusion area, wherein when the shutter transistor is non-conducting, a signal voltage representing light incident on the photogate is stored on the second capacitance that is coupled to one side of the shutter transistor and also coupled to the gate of the first transistor, so that the signal voltage is presented at the gate of the first transistor for read out.

2. The circuit of claim 1, wherein when the shutter transistor is conducting, the electrons stored in the first and second capacitances and the N+ floating diffusion area are converted into the signal voltage.

3. The circuit of claim 2, wherein the first capacitance and second capacitance include parasitic capacitance, source capacitance of the reset transistor, channel capacitance of the shutter transistor and the junction capacitance of the N+ floating diffusion area.

4. The circuit of claim 1, wherein the reset transistor and the shutter transistor are PMOS devices, the PMOS devices enabling a large voltage swing inside the pixel cell and greater dynamic range for the signal voltage.

5. The circuit of claim 1, wherein the reset transistor and the shutter transistor are NMOS devices, the NMOS devices enabling a small size for the pixel cell.

6. The circuit of claim 1, further comprising a P− well that is disposed adjacent to and around the circumference of the photogate, the P− well providing lateral confinement for electrons collected underneath the photogate and the absence of the P− well beneath the photogate enables electrons induced by infrared light to collect underneath the photogate.

7. The circuit of claim 1, further comprising a circuit that employs at least a correlated double sampling method to read out the signal voltage.

8. The circuit of claim 1, further comprising an image sensor that includes a plurality of pixel cells arranged in a grid.

9. The circuit of claim 1, further comprising a source follower circuit, the source follower circuit includes the first transistor and a second transistor, wherein when the second transistor conducts, the signal voltage is available for read out.

10. A circuit for a pixel cell, comprising:
    (a) a photogate disposed over a P− substrate, wherein electrons collect in a region underneath the photogate when a potential on the photogate is high and light is incident on the photogate;
    (b) an N+ floating diffusion area disposed adjacent to the photogate on the surface of the P− substrate and a first and a second capacitance coupled to opposite sides of a shutter switch, the N+ floating diffusion area and the first and second capacitances storing electrons that migrate from underneath the photogate when the potential on the photogate is low;
    (c) a reset switch coupled between the N+ floating diffusion area and a supply voltage, wherein the electrons stored in the N+ floating diffusion area move to the supply voltage when the reset switch closes; and
    (d) a first transistor having a gate coupled to the shutter switch and the N+ floating diffusion area, wherein when the shutter switch is open, a signal voltage representing light incident on the photogate is stored on the second capacitance that is coupled to one side of the shutter switch and also coupled to the gate of the first transistor, so that the signal voltage is presented at the gate of the first transistor for read out.

11. The circuit of claim 10, wherein when the shutter switch is closed, the electrons stored in the second capacitance are converted into the signal voltage.

12. The circuit of claim 10, wherein the reset switch and the shutter switch are PMOS devices.

13. The circuit of claim 10, wherein the first capacitance and the second capacitance include parasitic capacitance, source capacitance of the reset switch, channel capacitance of the shutter switch and the junction capacitance of the N+ floating diffusion area.

14. A pixel cell circuit, comprising:
- (a) means for collecting charges underneath a photogate when the photogate is active, a shutter is open and light is incident on the photogate;
- (b) means for storing electrons comprising a first means for storing electrons that is arranged to store electrons on a first side of the shutter, and a second means for storing electrons that is arranged to store electrons on a second side of the shutter, wherein the electrons migrate from beneath the photogate to the means for storing electrons when the photogate is inactive and the shutter is closed, and wherein the first side of the shutter is coupled to the photogate when the shutter is open;
- (c) means for closing the shutter to isolate a storage node on one side of the shutter;
- (d) a signal voltage that is related to the charge of the stored electrons, the signal voltage being representative of the amount of light incident on the photogate when the shutter is closed; and
- (e) means for reading out the signal voltage.

15. The pixel cell circuit as in claim 14, wherein the first means for storing electrons comprises a first capacitor, and the second means for storing electrons comprises a second capacitor.

16. The pixel cell circuit as in claim 14, wherein the pixel cell circuit further comprises a means for removing photo-induced charges that is arranged to remove photo-induced charges from underneath the photogate during a store period, such that a node at the first side of the shutter discharges during the store period, and wherein the means for reading out the signal voltage is configured to read out the signal voltage from the second side of the shutter during the store period.

* * * * *

UNITED STATES PATENT AND TRADEMARK OFFICE
CERTIFICATE OF CORRECTION

PATENT NO. : 6,720,592 B1
DATED : April 13, 2004
INVENTOR(S) : Willem J. Kindt et al.

It is certified that error appears in the above-identified patent and that said Letters Patent is hereby corrected as shown below:

Title page,
Item [73], Assignee, should read as follows:
-- [73]   Assignee:  National Semiconductor Corporation, Santa Clara, CA (US) --
Item [56], References Cited, U.S. PATENT DOCUMENTS,
Delete "2002/0011551 A1*     1/2002  Nair…………..250/208.1" and substitute with
-- 2002/001151 A1*     1/2002  Nair………………..250/208.1 --
FOREIGN PATENT DOCUMENTS,
Delete "JP     2000-174247    *       6/2000" (second occurrence)

Column 5,
Line 58, delete "on" and substitute with -- one --
Line 62, delete "preferable" and substitute with -- preferably --

Signed and Sealed this

Twenty-third Day of November, 2004

JON W. DUDAS
*Director of the United States Patent and Trademark Office*